(12) United States Patent
Mohammed

(10) Patent No.: US 8,865,570 B2
(45) Date of Patent: Oct. 21, 2014

(54) CHIPS WITH HIGH FRACTURE TOUGHNESS THROUGH A METAL RING

(71) Applicant: Invensas Corporation, San Jose, CA (US)

(72) Inventor: Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/146,080

(22) Filed: Jan. 2, 2014

(65) Prior Publication Data

US 2014/0141597 A1  May 22, 2014

Related U.S. Application Data

(62) Division of application No. 13/294,226, filed on Nov. 11, 2011, now Pat. No. 8,624,348.

(51) Int. Cl.
*H01L 21/00* (2006.01)
*H01L 29/66* (2006.01)

(52) U.S. Cl.
USPC .......................................... 438/465; 257/484

(58) Field of Classification Search
USPC ................... 438/114, 458, 465; 257/170, 484
See application file for complete search history.

(56) References Cited

U.S. PATENT DOCUMENTS

| | | | |
|---|---|---|---|
| 4,904,610 A | 2/1990 | Shyr | |
| 5,814,532 A | 9/1998 | Ichihara | |
| 6,136,668 A | 10/2000 | Tamaki et al. | |
| 6,998,712 B2* | 2/2006 | Okada et al. | 257/758 |
| 7,091,624 B2 | 8/2006 | Iijima et al. | |
| 7,223,673 B2 | 5/2007 | Wang et al. | |
| 7,224,060 B2 | 5/2007 | Zhang et al. | |
| 7,550,367 B2 | 6/2009 | Tamura et al. | |
| 7,871,902 B2 | 1/2011 | Kaltalioglu et al. | |
| 7,892,949 B2 | 2/2011 | Abe et al. | |
| 7,955,955 B2* | 6/2011 | Lane et al. | 438/465 |
| 8,624,348 B2* | 1/2014 | Mohammed | 257/484 |
| 2003/0122220 A1 | 7/2003 | West et al. | |
| 2004/0009650 A1 | 1/2004 | Jeong et al. | |
| 2004/0137702 A1 | 7/2004 | Iijima et al. | |
| 2004/0188843 A1 | 9/2004 | Wakayama et al. | |
| 2005/0003633 A1 | 1/2005 | Mahle et al. | |
| 2005/0006728 A1 | 1/2005 | Shizuno | |
| 2005/0101109 A1 | 5/2005 | Chin et al. | |
| 2005/0202596 A1 | 9/2005 | Fukuyo et al. | |
| 2005/0202650 A1 | 9/2005 | Imori et al. | |
| 2005/0260810 A1 | 11/2005 | Cheng et al. | |
| 2006/0082003 A1 | 4/2006 | Shizuno | |
| 2007/0066044 A1 | 3/2007 | Abe et al. | |

(Continued)

FOREIGN PATENT DOCUMENTS

JP    2005-116844 A    4/2005

*Primary Examiner* — Calvin Lee
(74) *Attorney, Agent, or Firm* — Lerner, David, Littenberg, Krumholz & Mentlik, LLP

(57) ABSTRACT

A method of making an edge-reinforced microelectronic element is disclosed. The steps include mechanically cutting along dicing lanes of a substrate at least partially through a thickness thereof to form a plurality of edge surfaces extending away from a front surface thereof and forming a continuous monolithic metallic edge-reinforcement ring that covers each of the plurality of edge surfaces and extends onto the front surface. The front surface may have a plurality of contacts thereat and the substrate may embody a plurality of microelectronic elements.

8 Claims, 15 Drawing Sheets

(56) References Cited

U.S. PATENT DOCUMENTS

2007/0170159 A1 7/2007 Fukumitsu
2009/0008750 A1 1/2009 Tokitoh
2011/0006389 A1 1/2011 Bachman et al.

* cited by examiner

CHIPS WITH HIGH FRACTURE TOUGHNESS THROUGH A METAL RING

CROSS REFERENCE TO RELATED APPLICATIONS

The present application is a divisional of U.S. patent application Ser. No. 13/294,226, filed Nov. 11, 2011, which is set to issue as U.S. Pat. No. 8,624,348 on Jan. 7, 2014, the disclosure of which is incorporated herein by reference.

BACKGROUND OF THE INVENTION

The subject matter of the present application relates to semiconductor devices. More specifically, the present application relates to reinforcing the edge of an integrated circuit to obviate cracks in layers of the integrated circuit during separation.

Microelectronic elements, e.g., semiconductor chips, are thin, flat elements which can incorporate integrated circuits including active semiconductor devices such as transistors, diodes, etc., and wiring which provides electrical interconnections. Semiconductor chips may also or alternatively include passive devices such as capacitors, inductors or resistors. In particular constructions, a microelectronic element can include one or more semiconductor chips and have electrically conductive elements electrically connected with contacts of the one or more semiconductor chips, the contacts being exposed at a surface of the microelectronic element.

Microelectronic elements are typically manufactured in wafer form. Once the wafer is formed, the wafer may then be diced to free the individually packaged microelectronic elements, i.e., die. One of the complications that arise when the wafer is separated is the presence of microdefects. Microdefects commonly occur around the periphery of each microelectronic element, e.g., semiconductor chip, due to stresses at the edge surfaces of each of the microelectronic elements. For example, without limitation, such defects can include cracks in the microelectronic element, surface roughness, sharp edge points, uneven surfaces, and the like. Such microdefects can occur in the microelectronic element at any point it time. For example, the dicing process produces microdefects that can develop into cracks and more serious defects. These microdefects may occur at any time later in the life-cycle of the chip, i.e., during processes for packaging, or testing the chip, or later in actual operation of the chip.

Various structures and methods have been devised to minimize crack stresses. For example, internal seal rings have been used in the prior art to prevent cracking at the exterior edges of the semiconductor chip. Methods that have been used to separate wafers into individual chips include mechanical blade dicing; mechanical scribing and then breaking; dicing before grinding; laser scribing and breaking; stealth dicing; laser full-cut dicing, and plasma dicing. Nonetheless, despite these and other improvements in the art, there is still room for improved microelectronic elements and methods of making microelectronic elements.

BRIEF SUMMARY OF THE INVENTION

In one aspect of the presently disclosed embodiments, a microelectronic element includes a semiconductor chip and a continuous monolithic metallic edge-reinforcement ring. The semiconductor chip has front and rear opposed surfaces. A plurality of contacts is exposed at its front surface. Edge surfaces extend between the front and rear surfaces and the semiconductor chip embodies at least one of active devices or passive devices. The continuous monolithic metallic edge-reinforcement ring covers each of the plurality of edge surfaces and extends onto the front surface.

In one embodiment, the semiconductor chip has at least one crack at at least one of its edge surfaces. The edge-reinforcement ring extends into the at least one crack.

In an alternative embodiment, a dielectric layer separates the edge-reinforcement ring from the plurality of edge surfaces.

In another alternative embodiment, there is a first dielectric layer and a second dielectric layer. The edge-reinforcement ring will separate the second dielectric layer from the first dielectric layer.

In an alternative embodiment, the edge-reinforcement ring includes at least one metal selected from the group consisting of aluminum, tungsten, nickel, chromium, and copper.

In still another embodiment, the microelectronic package has terminals electrically connected with the contacts of the microelectronic element.

In another embodiment, the edge-reinforcement ring extends onto the rear surface.

In yet another alternative embodiment, an angle between at least one of the edge surfaces of the semiconductor chip and its front surface is greater than 90 degrees. Alternatively, an angle between at least one of the edge surfaces and the front surface is less than 90 degrees.

In another aspect of the claimed invention, there is a method of making an edge-reinforced microelectronic element. The steps include mechanically cutting along dicing lanes of a substrate at least partially through a thickness thereof to form a plurality of edge surfaces extending away from a front surface thereof. The front surface may have a plurality of contacts exposed thereat and the substrate may embody a plurality of microelectronic elements. A continuous monolithic metallic edge-reinforcement ring may be formed that covers each of the plurality of edge surfaces and extends onto the front surface.

In an alternative embodiment, the step of mechanically cutting fully cuts through the thickness of the substrate to separate the microelectronic elements from one another.

In another embodiment of this aspect, the step of forming a continuous monolithic metallic edge-reinforcement ring occurs after the step of mechanically cutting.

In another embodiment, the step of mechanically cutting partially cuts through the thickness; and wherein the step of forming occurs after the step of mechanically cutting. 14. Alternatively, during the step of mechanically cutting, a groove is formed, the groove having a base and the edge surfaces; and wherein the step of forming a continuous monolithic metallic edge-reinforcement ring includes providing a metal along the base and the edge surfaces of the groove.

In another embodiment, the step of mechanically cutting includes sawing.

Turning to another aspect of the present invention, a method of making an edge-reinforced microelectronic element includes mechanically cutting along dicing lanes of a substrate partially through a thickness thereof to expose a plurality of edge surfaces extending away from a front surface thereof. The first surface may have a plurality of contacts exposed thereat and the substrate may embody a plurality of microelectronic elements. A continuous monolithic metallic edge-reinforcement ring may be formed that covers each of the plurality of edge surfaces and extends onto the front surface. The microelectronic elements may be separated from one another along the dicing lanes.

In an alternative embodiment, the step of mechanically cutting includes sawing.

DETAILED DESCRIPTION

Figure 1:
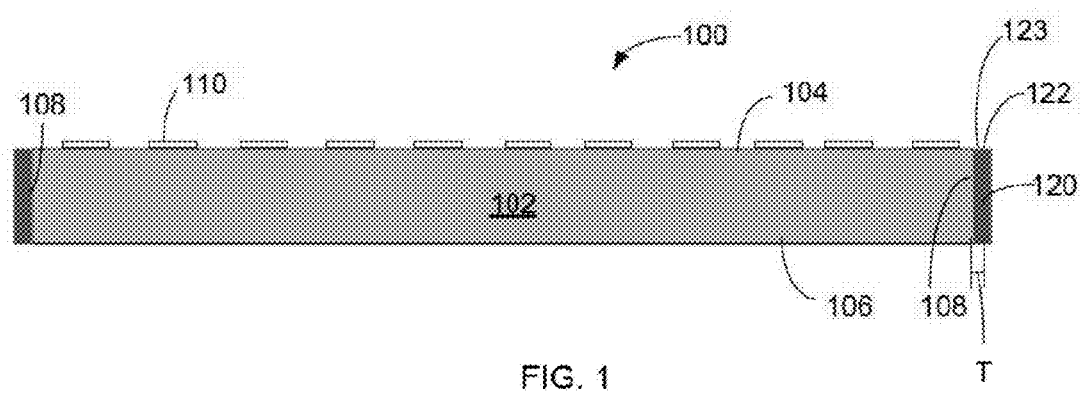
FIG. 1 is a cross-sectional view of a microelectronic element in accordance with one embodiment of the invention.

Referring first to FIG. 1, there is shown a cross-sectional view of a microelectronic element 100 in accordance with an embodiment of the invention. In this embodiment, the microelectronic element 100 includes a semiconductor chip 102, e.g., integrated circuit, and a metallic or metal edge-reinforcement ring 120 that covers at least a portion of edge surfaces 108 of the chip 102. Chip 102 may be a semiconductor chip having a plurality of active circuit elements. In other embodiments, chip 100 may be a wafer or a portion of a wafer containing a plurality of semiconductor chips. In still another example, chip 100 may be reconstituted wafer or panel including a plurality of active chips arranged in an array and held together for processing simultaneously.

With reference still to FIG. 1, the chip 102 includes a front surface 104, an opposed rear surface 106, and peripheral edge surfaces 108 that extend between the front and rear surfaces 104,106 and around the periphery of the chip 102. The chip 102 may include a plurality of contacts, e.g., bond pads 110 exposed at the front surface.

The metal or metallic ring 120 is shown extending around the peripheral edge 108 of the chip 102. The metal ring 120 is continuous and monolithic and helps to reinforce the peripheral edge 108 of the chip 102. In certain embodiments, the presence of the metal ring 120 can increase the resistance of the chip 102 to cracking and help to minimize brittle fracture initiation defects. This can also help to improve chip handling, assembly, and reliability.

In this embodiment, the metal ring may be comprised of known metals, including, without limitation, aluminum (Al), tungsten (W), nickel (Ni), chromium (Cr), copper (Cu), or alloys of one or more of the aforementioned metals. A thin layer of a different metal or conductive compound of a metal may in some cases contact the semiconductor material at the peripheral edge surfaces to promote adhesion or to act as a barrier between the semiconductor material and a thicker layer of metal making up a bulk of the metal ring 120. For example, a thin layer of metal nitrides can be provided for this purpose. In this embodiment, as best shown in FIG. 1, the outer surface 123 of the first end 422 of the metal ring 120 lies in the same plane or is substantially flush with the front surface 104 of the chip 102. Similarly, the outer surface 125 of second end 124 of the metal ring 120 lies in the same plane or is substantially flush with the rear surface 106 of the chip 102. In an exemplary embodiment, the metal ring 120 may have a thickness T ranging from 50 nanometers to 10 microns. In a particular embodiment, the metal ring 120 can serve as a ground reference for the chip 102.

Figure 1A:
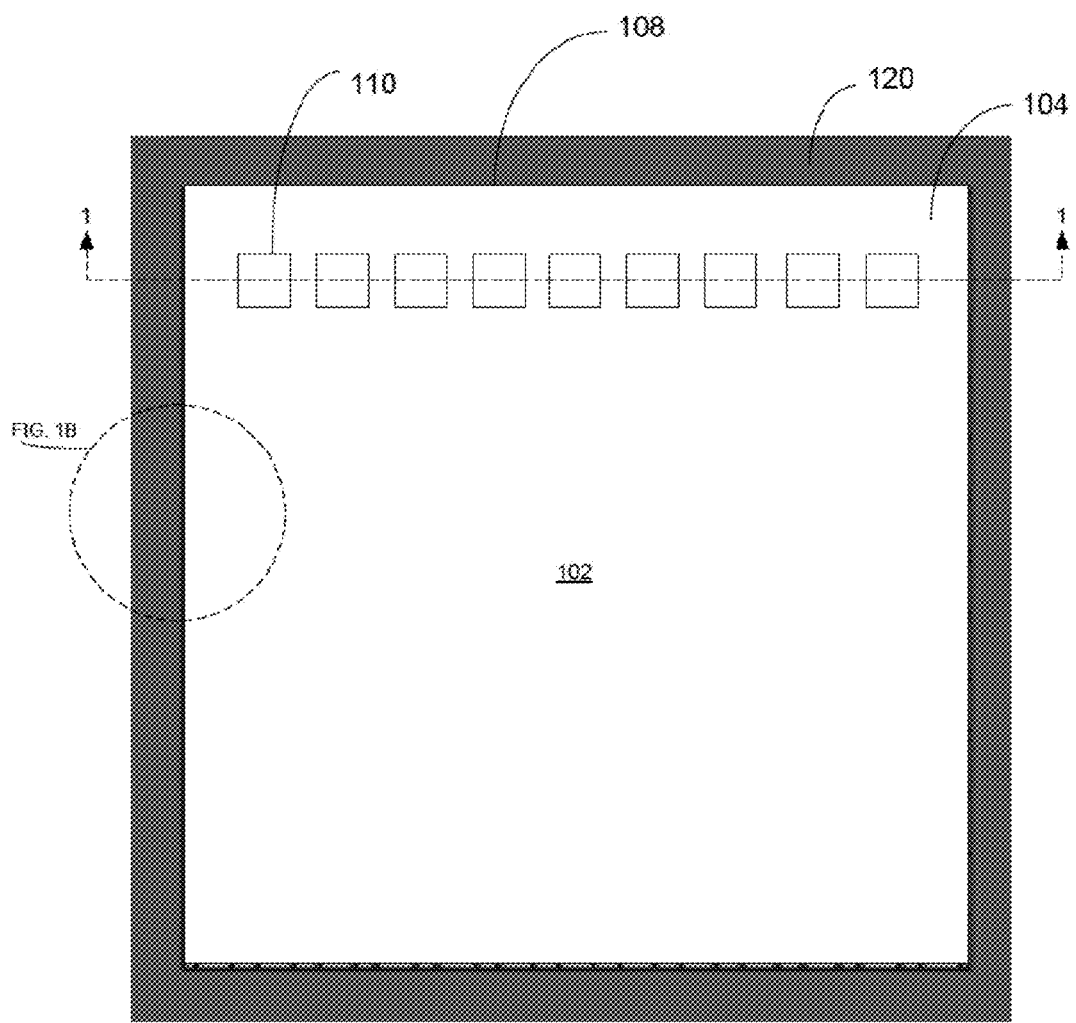
FIG. 1A is a top plan view of FIG. 1.
Figure 1B:
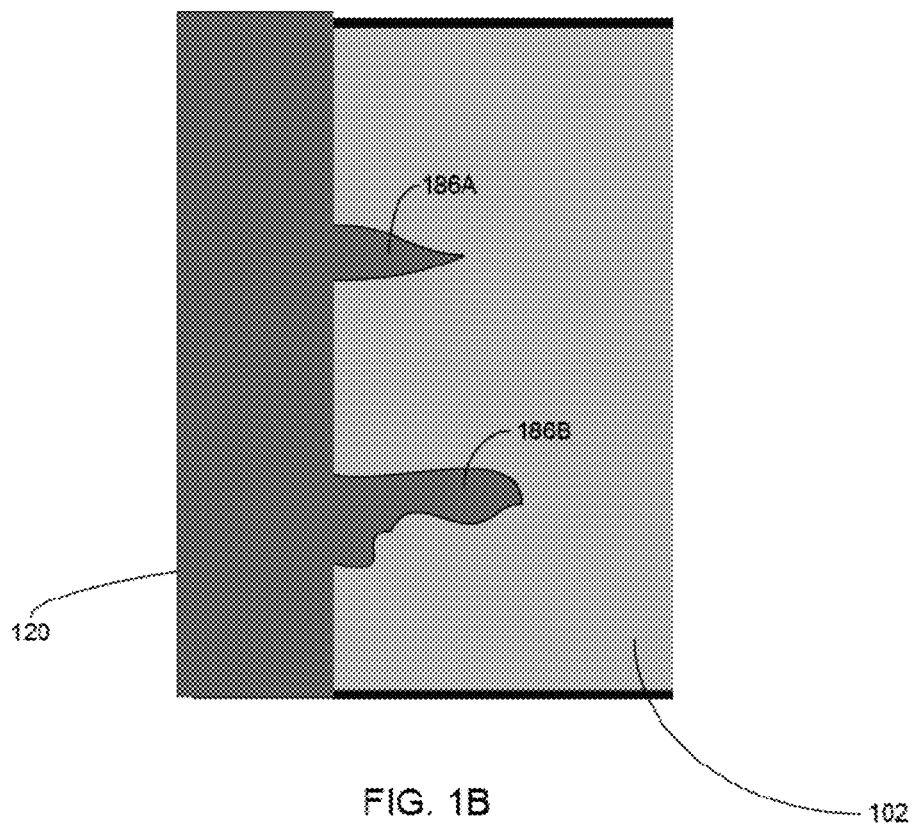
FIG. 1B is an enlarged view of a portion of FIG. 1A.

Referring to FIG. 1B, an enlarged portion of FIG. 1A, chip 102 is shown having two microcracks extending away from its peripheral edge surface 108. As shown, metal from the metal ring 120 can extend into each of the two cracks. The deposited material may have properties that can help to avoid the microdefects which they coat or fill from developing into such larger defects. For example, deposited material can be selected that has higher fracture toughness or higher ductility than the material of which the chip essentially consists. This can help to further prevent or minimize microdefects. It may also have these properties relative to a dielectric material in which one or more wiring layers of the chip are disposed. For example, low-K dielectric materials provided as interlayer dielectric materials tend to be relatively brittle, prone to cracking and delaminating. In alternative embodiments, there may be no cracks, one or more cracks, or cracks with no metal within them or only partially filled with metal.

Figure 2:
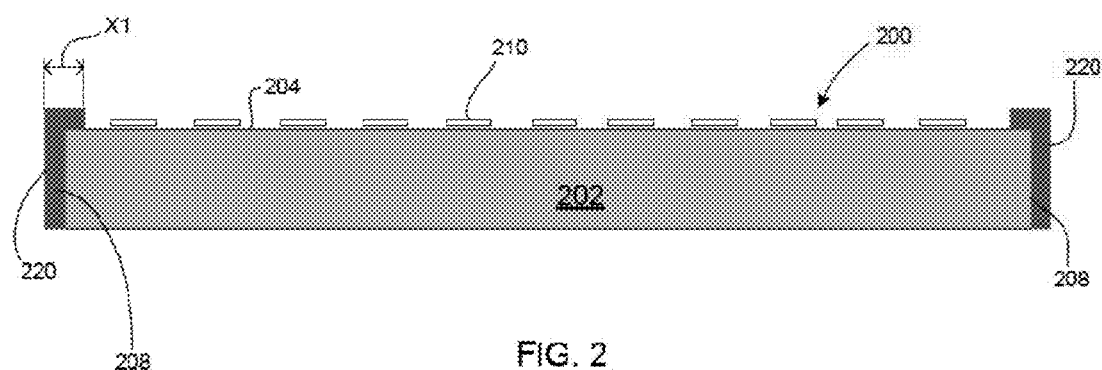
FIG. 2 is an alternative embodiment of the microelectronic element shown in FIG. 1.
Figure 2A:
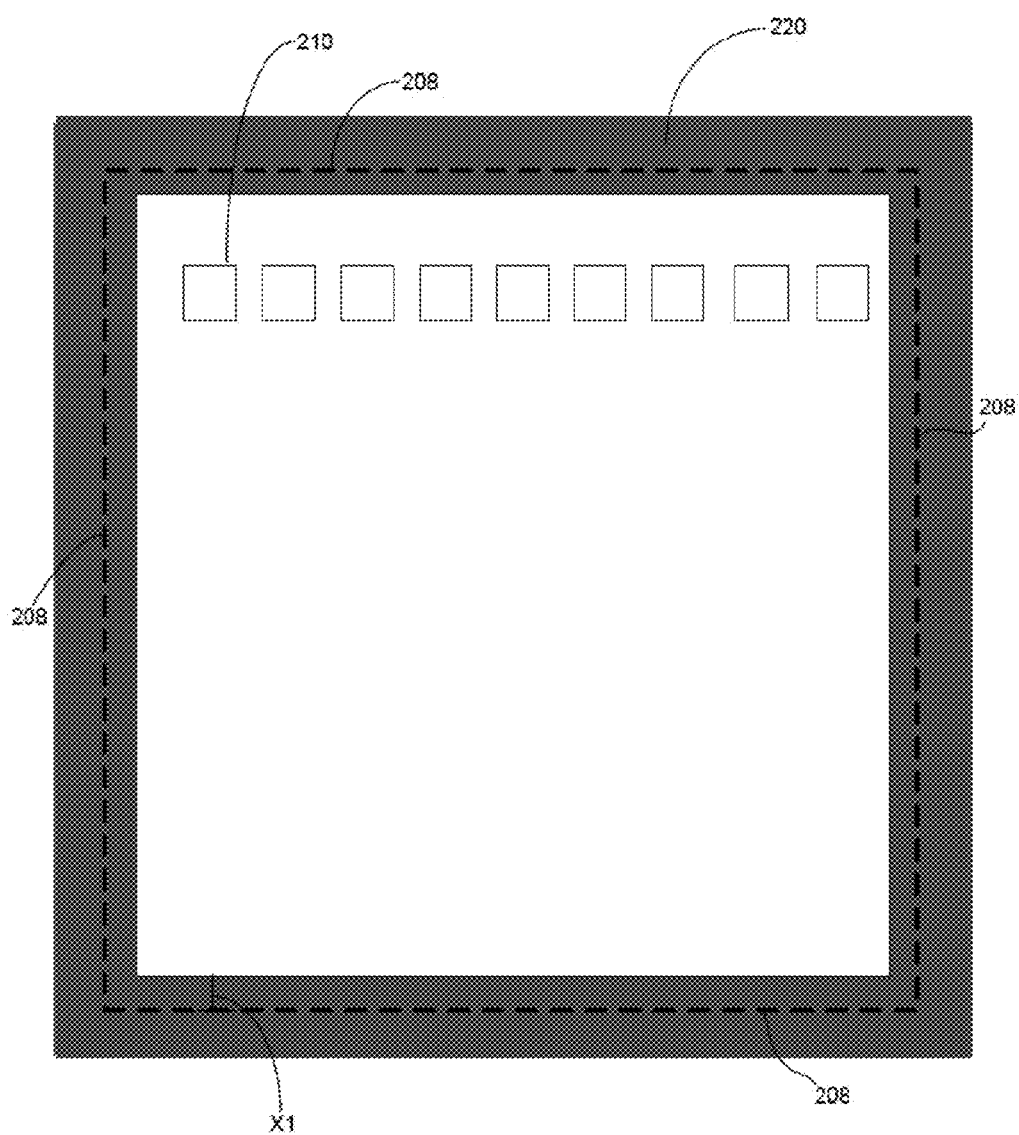
FIG. 2A is a top plan view of FIG. 2.

Turning now to alternative embodiments, it is to be appreciated that similar reference numerals will be used to indicate similar elements. With reference to FIGS. 2-2A, an alternative microelectronic element 200, a monolithic metal ring 220 is shown extending continuously along the outer peripheral edge surfaces 208 of the chip 202. In contrast to the embodiment of FIG. 1, in addition to the metal ring 220 extending adjacent the peripheral edge 208 of the chip, the metal ring 220 also extends along at least one other surface of the chip 202. In this embodiment, the metal ring 220 extends onto the front surface 204 of the chip 202 as a continuous rectangular ring structure that appears to "wrap around" from the peripheral edge surface 208.

As shown, the metal ring 220 may extend a distance X1 inwardly along the front surface 204 from peripheral edge surfaces 208 of the chip 202, for example, a distance X1 ranging from 1 to 50 microns.

Figure 3:
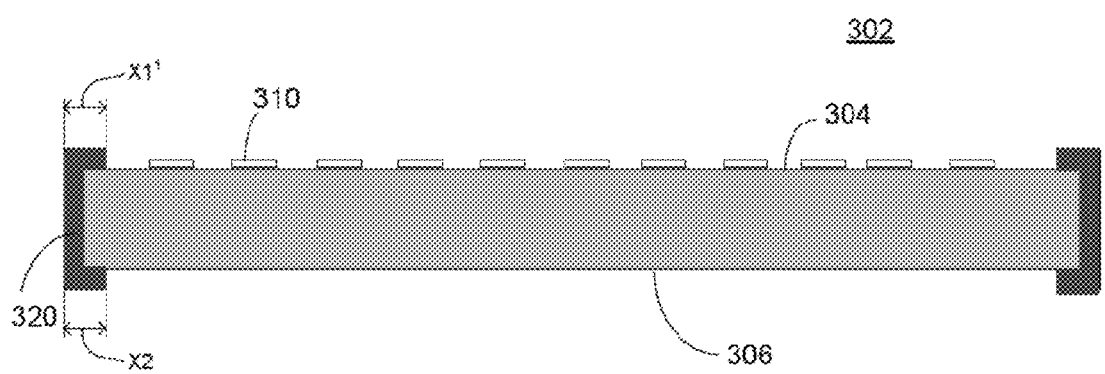
FIG. 3 is a cross-sectional view of a microelectronic element in accordance with one embodiment of the invention.

Referring now to FIG. 3, an alternative microelectronic element 300 is shown. In this exemplary embodiment, the monolithic metal ring 320 extends onto both the front surface 304 and the opposed rear surface 306 of the chip 302. As in the embodiment shown in FIG. 2, the metal ring 320 may extend along the rear surface 206 of the chip 302 a distance X2, which may range from 1 to 50 microns. The distance X1' can be substantially equal to the distance X2. This is commonly due to overlay tolerances and design. In alternative embodiments, the distances X1' and X2 may differ.

Figure 4:
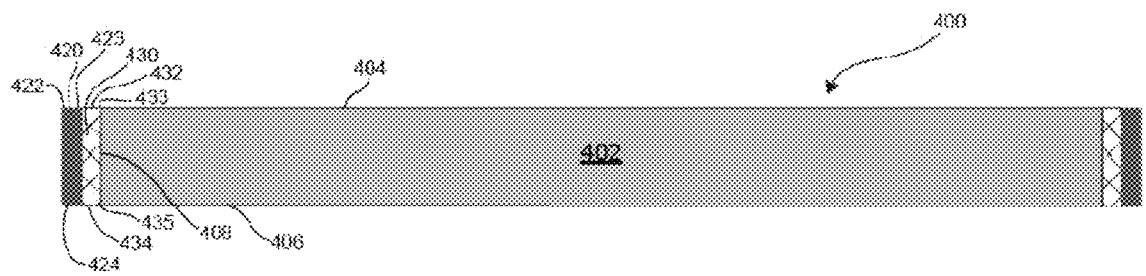
FIG. 4 is a cross-sectional view of a microelectronic element in accordance with one embodiment.
Figure 5:
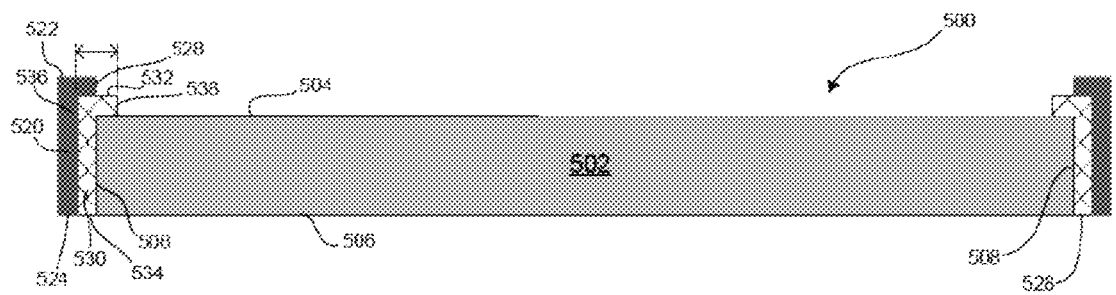
FIG. 5 is a cross-sectional view of an alternative embodiment of FIG. 4.
Figure 6:
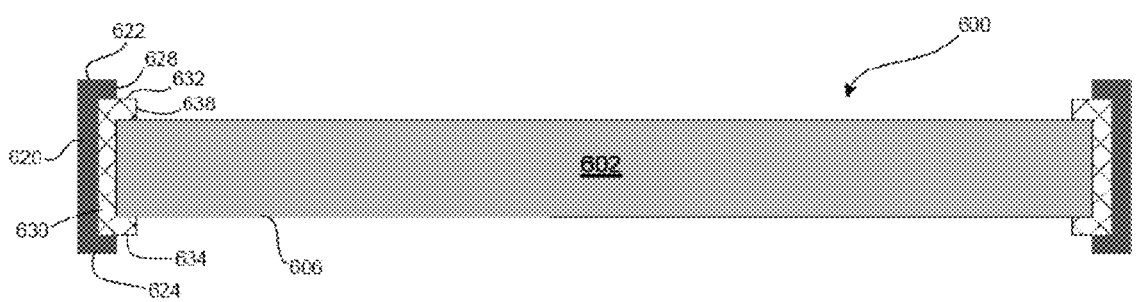
FIG. 6 is a cross-sectional view of an alternative embodiment of FIG. 4.

Turning now to FIGS. 4-6, alternative arrangements of microelectronic elements are shown, wherein a dielectric layer is disposed between the monolithic metal ring and the semiconductor material of the chip 402. Referring first to FIG. 4, a semiconductor chip 402 is shown. An insulating layer, such as a dielectric layer 430 surrounds the peripheral edge 408 of the chip 402. In one embodiment, the outer surface 433 of the first end 432 of dielectric layer 430 is planar with the front surface 404 of the chip 402. The surface 435 of the second end 434 dielectric layer 430 may also be planar with the rear surface 406 of the chip 402. The dielectric layer 430 may also fill microdefects in the chip 402 to help avoid the microdefects which they coat or fill from developing into such larger defects. The dielectric layer 430 can be comprised of known dielectric materials, such as, without limitation, polymer. Metal ring 420 is provided adjacent the dielectric layer. The outer surface 423 of the first end 422 of the metal ring 420 may be substantially planar with the surface 435 of the first end 432 of dielectric layer 430. The surface 425 of the second end 424 of the metal ring 420 may also be planar with the outer surface 435 of the second end 434 of the dielectric layer 430. The dielectric layer may be deposited, without limitation, by electrophoretic deposition, spin-coating, (such as paralyne), dry deposition techniques: e.g., to form a layer of SiOx, SiN, or CVD (chemical vapor deposition) or plasma-enhanced CVD (PECVD), or by siloxane-based polymer deposition, or organosilicon polymer deposition.

With reference to FIG. 5, an alternative microelectronic element 500 is shown with dielectric layer 530 wrapping around at least one surface of the chip 502. In this embodiment, the dielectric layer 530 extends adjacent the peripheral edge 508 of the chip 502. A first end 532 of the dielectric layer may extend onto or "wrap around" to the front surface 504 of the chip 502. Second end 534 of the dielectric layer may in some cases be co-planar or flush with the rear surface 506 of the chip 502. In this cross-sectional view, the dielectric layer is wrapped around the chip 502 in an L-shape. The metal ring 520 is provided around the dielectric layer 530. As shown, monolithic metal ring 520 covers and extends along the outer peripheral edge surfaces 536 of the dielectric layer 530, and may form a continuous ring fully circumscribing the area of the front face 504 of the semiconductor chip. The metal ring 520 also wraps around the first end 532 of the dielectric layer 530. In this embodiment, the first end 522 of the metal ring 520 does not completely overlie the first end 532 of the dielectric layer. The interior peripheral edge 538 of the dielectric layer 530 may in some cases be spaced apart from the interior peripheral edge 528 of the metal ring 520, thereby creating a step between the two interior peripheral edges 538, 528. The staggering of the metal ring 520 and dielectric layer 530 can be accomplished using two different masks, a first mask (not shown) during deposition of the dielectric layer 530 and a second mask (not shown) during deposition of the metal ring 520.

In an alternative embodiment, the edges 538 of the dielectric layer 530 and the edge 522 of the metal ring 520 metal can be aligned, such as when a single mask is used to pattern both. Also, in a variation of that shown, the metal layer can contact the front surface 504 of the chip 502 beyond an edge of the dielectric layer 530, particularly when the chip 502 has a dielectric layer at the front surface 504.

The alternative microelectronic element 600 of FIG. 6 is similar to the embodiment of FIG. 5, except that the second end 634 of the dielectric layer 630 and second end 624 of the metal ring 620 are not co-planar with the rear surface 606 of the chip 602. As shown, the second end 634 of the dielectric layer 630 may extend onto the rear surface 606 of the chip 602. The second end 624 of the metal ring 620 may also extend onto the dielectric layer 634. As in the previous embodiment, the first interior edge 638 of the dielectric layer 634 can in some cases be spaced apart from the first interior edge 628 of the metal ring 620. In an exemplary embodiment, the first and second ends 622,624 of the metal ring 630 will extend over the respective first and second ends 632, 634 of the dielectric layer 634 an equal amount, such that the metal plate 620 symmetrically wraps around the dielectric layer 634. Similarly, the first and second ends 632, 634 of the dielectric layer 634 may be symmetrically provided around the chip 602. Alternatively, edges 628 of the metal ring can be aligned with, i.e., not spaced apart from, corresponding edges 638 of the dielectric layer 630.

Figure 7:
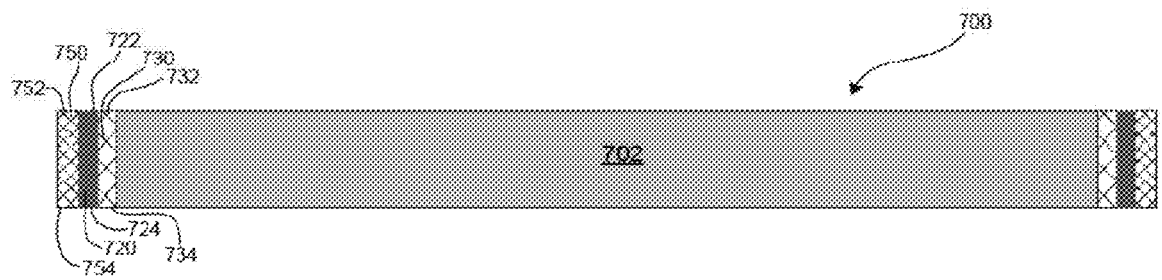
FIG. 7 is a cross-sectional view of one embodiment of the invention.
Figure 8:
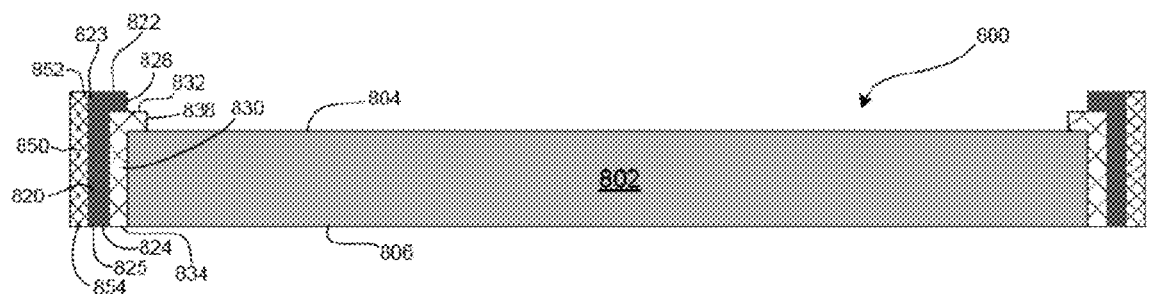
FIG. 8 is a cross-sectional view of an alternative embodiment of FIG. 7.
Figure 9:
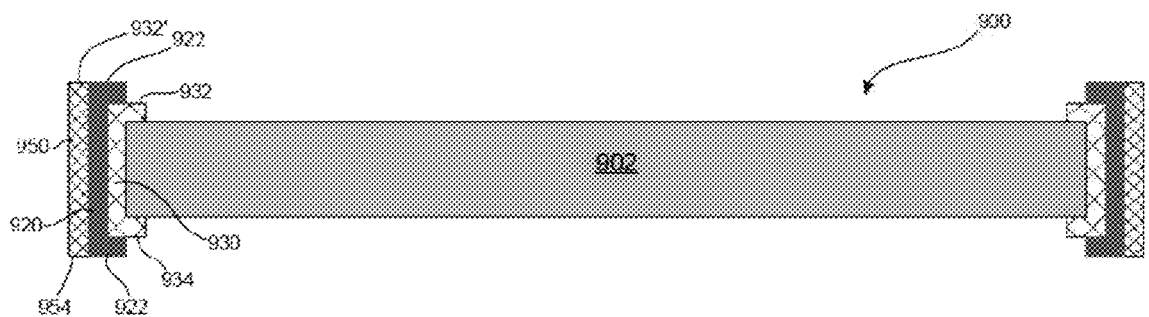
FIG. 9 is a cross-sectional view of an alternative embodiment of FIG. 7.

Referring now to FIGS. 7-9, alternative microelectronic elements are described that include two dielectric layers separated by a metal ring. Turning first to FIG. 7, a microelectronic element is shown with a metal ring disposed between a first dielectric layer 730 and a second dielectric layer 750. As in FIG. 4, the first dielectric layer 730 is adjacent and closest to the chip 702, and the metal ring 720 is adjacent and wraps around the first dielectric layer 730. In this embodiment, there is a second dielectric layer 750 that is provided around the outer peripheral edge 726 of the metal ring 720. The first end 750 of the second dielectric layer 750 is planar or flush with the respective first ends 722, 732 of the metal ring 720 and first dielectric layer 732

Turning now to FIG. 8, in this embodiment, the first end 832 of the first dielectric layer 830 extends over the front surface 804 of the chip 802. The second end 834 is planar with the rear surface 806 of the chip. Similarly, the first end 822 of the metal ring extends over a portion of the first dielectric layer 832. As shown, the interior edge 838 of the first dielectric layer 830 is spaced away from the interior edge 828 of the metal ring 820. The second dielectric layer 850 is provided around and covers the metal ring 820. As shown, the second dielectric layer 850 is flush or planar with the outer edge surface 823 of the first end 822 of the metal ring 820, as well as the outer edge surface 823 of the second end 824 of the metal ring 820.

With reference to FIG. 9, an alternative microelectronic element 900 is shown. As in the previous embodiment of FIG. 6, there is a first dielectric layer 830 with first and second ends wrapping around the chip 902. First and second ends 822,824 of metal ring 920 wrap around respective first and second ends 832,834 of the first dielectric layer 930. In contrast to the embodiment of FIG. 6, a second dielectric layer 950 is provided adjacent the outer peripheral edge of the second dielectric layer 950. The first end of the second dielectric layer may be planar with the top edge of the metal ring. Similarly, the second end 854 of the second dielectric layer 950 is flush with the second end 824 of the metal ring 920.

Figure 10:
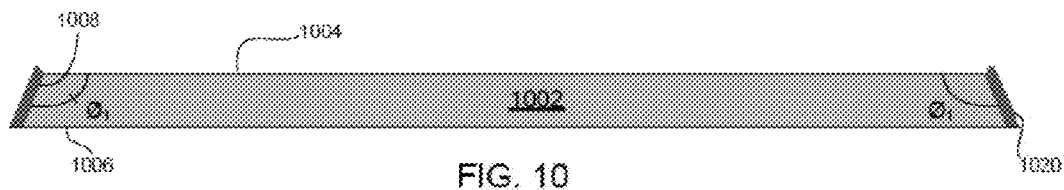
FIG. 10 is a cross-sectional view of an alternative embodiment of FIG. 1.
Figure 11:
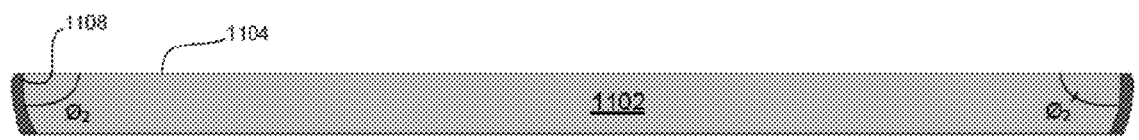
FIG. 11 is a cross-sectional view of an alternative embodiment of FIG. 1.

Turning now to FIGS. 10-11, in alternative embodiments, the angle between the outer peripheral edge of the chip and the rear surface (or front surface) of the chip does not always need to be at a substantially right angle (i.e., a 90 degree angle). For example, as shown in FIG. 10, the angle $\theta_1$ between the front surface 1004 of the chip 1002 and peripheral edge is greater than 90 degrees. In this embodiment, the angle $\theta_1$ may be 100 degrees, although it may range anywhere from 30 to 150 degrees (between the front surface 1004 and the outer peripheral edge surfaces 1008 of the chip). Metal ring 1120 will then likewise wrap around the chip 1102 at a similar angle. The peripheral edge surfaces 1108' of the chip 1002' may also be rounded, as shown in FIG. 11. In this alternative embodiment, the angle θ₂ between the front surface 1106' and the outer peripheral edge 1108' will also range from 30 to 150 degrees between the front surface 1104 and peripheral edge 1108, and may in some cases be less than 90 degrees, as shown in FIG. 11. The metal ring 1120' will wrap around the outer peripheral edge 1108' at a similar angle.

Figure 12:
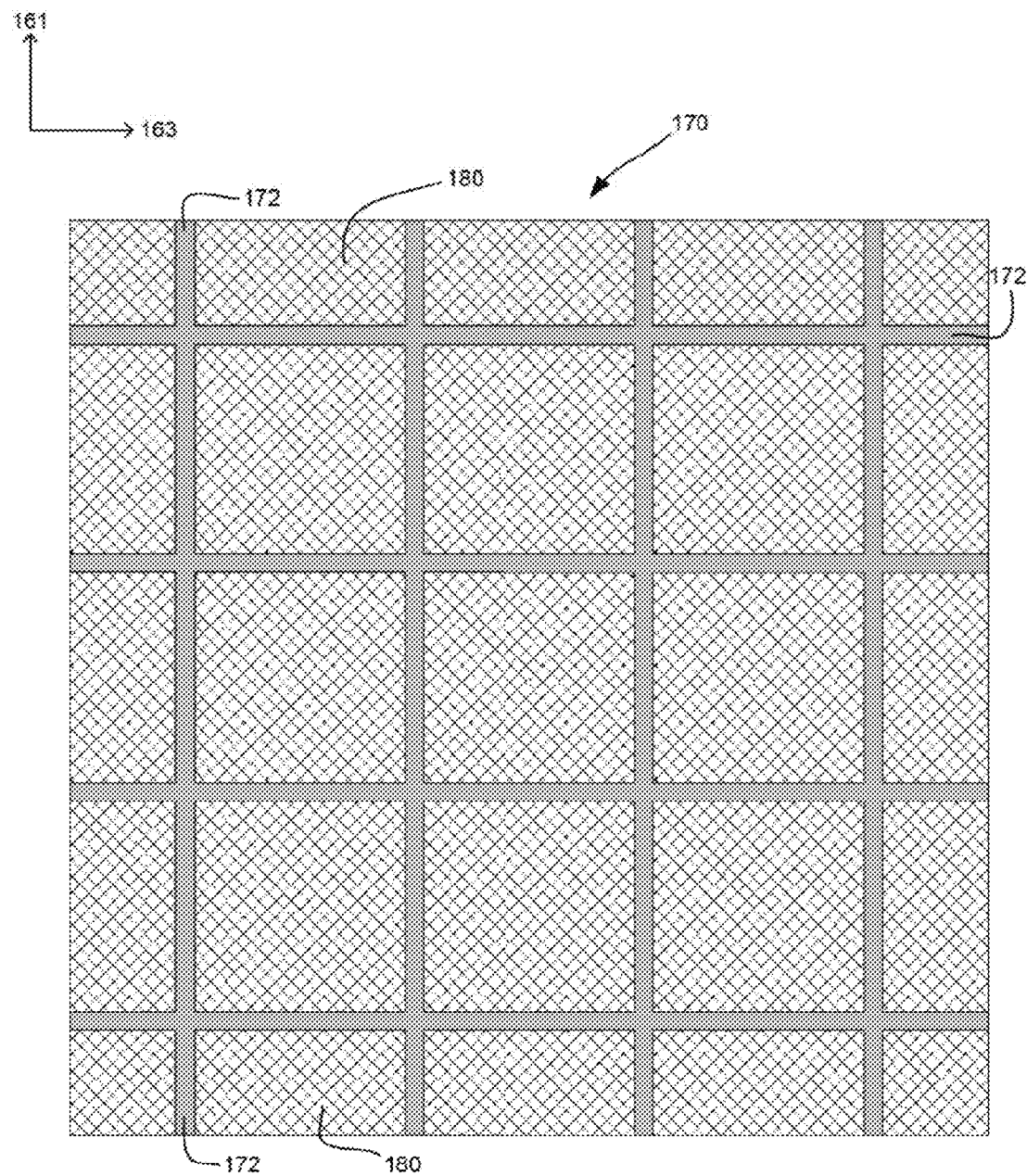
FIGS. 12, 12A, 12B, 12C, 12D, 12E, 12F, and 12G illustrate a method of making the microelectronic element of FIG. 2 in accordance with one embodiment.
Figure 12A:
Figure 12B:
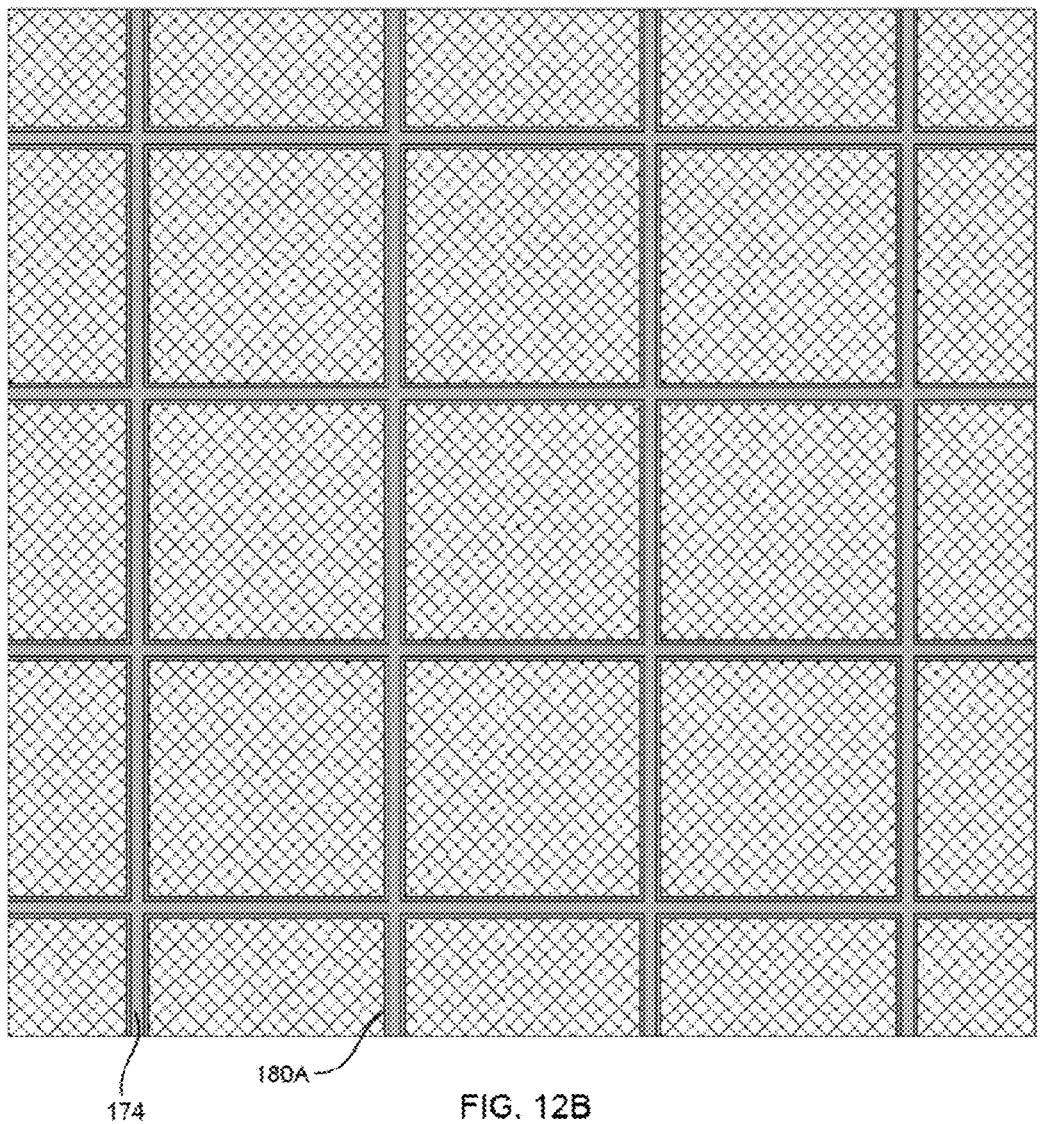
Figure 12C:
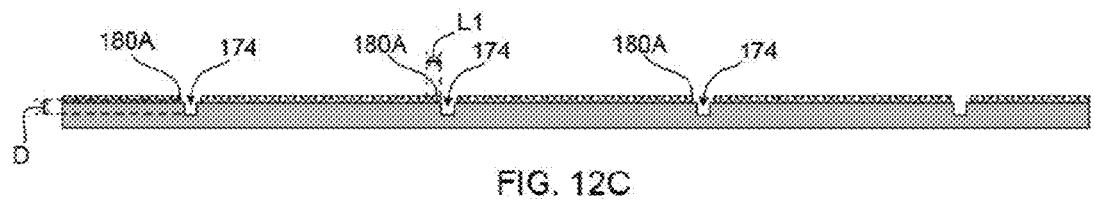
Figure 12D:
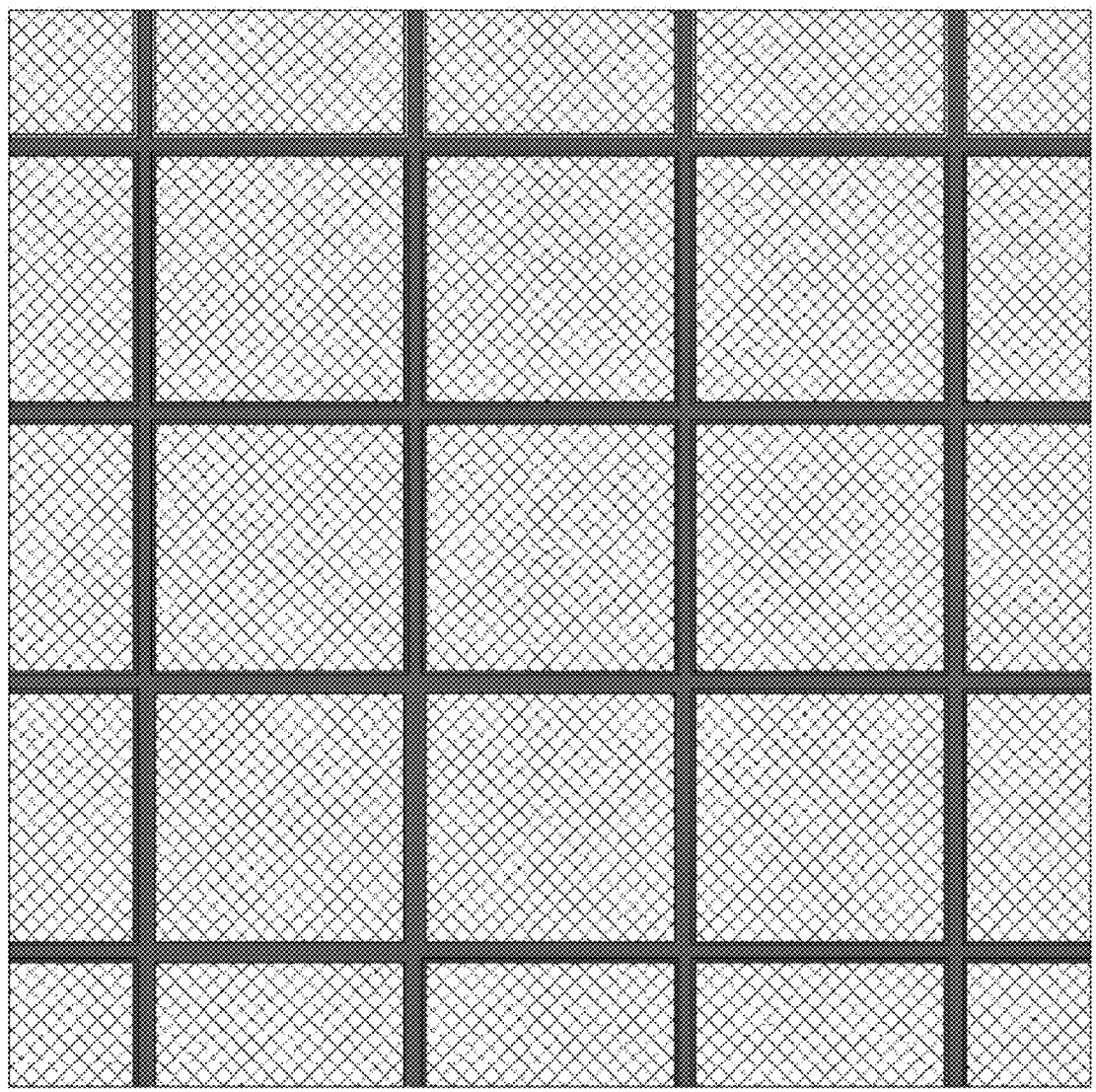
Figure 12E:
Figure 12F:
Figure 12G:

Turning to FIGS. 12-12G, a method of making the microelectronic element of FIG. 1 in accordance with one embodiment is shown. Turning first to FIG. 12, a top plan view of a wafer subassembly 170 is shown. When a wafer-level fabrication method is used to produce the structure shown in FIG. 1 as contemplated in one embodiment herein, the structure at this stage of fabrication can include a device wafer 171 with a photoresist 180 patterned on the top surface 104 thereof. The photoresist 180 may be patterned to provide mask patterns 180 defining a series of channels 172 extending in first and second orthogonal directions 161,163 across the top surface 173 of the wafer 170 coincidental with a plurality of dicing lanes. In this embodiment, the channels 172 intersect one another. Dicing lanes may typically be 30-40 microns wide.

Referring now to FIGS. 12B-C, grooves 174 may be formed in the wafer by removing material exposed within the channels 172 of the resist mask. In one embodiment, the grooves can be formed by sawing or scribing partially through a thickness of the wafer 171 to a depth D. As best seen in FIG. 12C, the grooves 174 are created to a desired depth D. In one embodiment, the depth of the grooves will be equal to or greater than the final thickness T (FIG. 12G) of the final chip. For example, the grooves 174 may have a depth D ranging from 10 to 200 microns deep. In this embodiment, the outermost edge portion 180A of the photoresist material may be spaced a distance L1 away from the edge of the grooves 174. In one example, the distance L1 is 1 to 50 microns. Turning to FIGS. 12, 12A, once the grooves 174 are formed, a metal 182 may be deposited within the grooves 182 and onto the top surface 173 of the device wafer 171. The metal may be deposited using any known means, such as plating, electrophoretic deposition or the like. The device wafer 171 may then be thinned to separate the device wafer 171 into individual components 171A-E. As described above, in a particular example, the metal deposition can be a plurality of depositions resulting in a plurality of component layers, e.g., one or more of a catalyst, seed layer, adhesion layer, barrier layer, and a primary layer typically having greater thickness. Thereafter, the photoresist material 180 can be removed resulting in a plurality of microelectronic elements 171A-E, which are identical to the microelectronic element described in FIG. 2. In particular examples, a dielectric layer 430 or 530 (FIG. 4 or 5) can be formed in the grooves 174 prior to forming the metal layer therein. Alternatively, they may be formed on a surface of a diced microelectronic element as the dielectric layer 630 seen in FIG. 6. In yet another example, a dielectric layer 750, 850 or 950 (FIGS. 7-9) can be formed after forming the metal ring-forming layer 182 or after separating the wafer into individual microelectronic elements.

Figure 13:
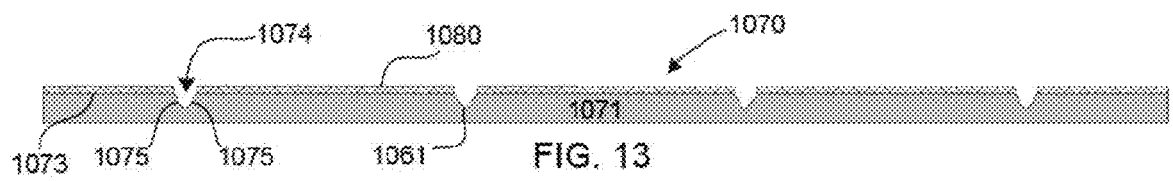
FIGS. 13, 13A, 13B, and 13C illustrate cross-sectional views of a method of making the embodiment of FIG. 10 in accordance with one embodiment.
Figure 13A:
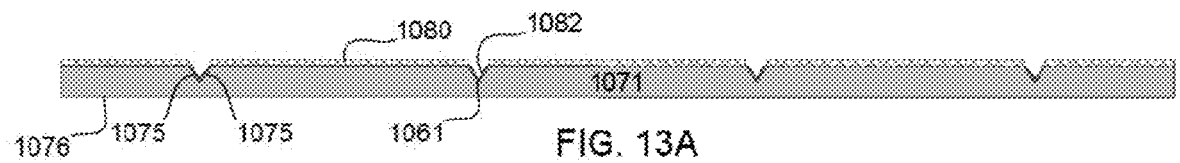
Figure 13B:
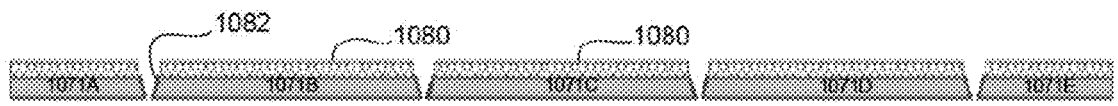
Figure 13C:

Referring to FIGS. 13-13C, a method of making the microelectronic element 1002 of FIG. 10 in accordance with one embodiment is shown. As shown in FIG. 13, a wafer subassembly 1070 is shown with photoresist 1080 patterned on the front surface 1073 of the device wafer 1171 and grooves 1074 formed within the device wafer 1071. Unlike the embodiment of FIGS. 12-12G, the grooves 1074 have inclined surfaces 1075 that meet at one end to form an edge 1061. A metal 1082 may then be deposited on the inclined surfaces 1075 within the grooves 174, as shown in FIG. 13A. Turning to FIG. 13B, the device wafer 1071 may be thinned from the rear surface 1076 of the wafer 1071 so that device wafer components 1071A-1071e may be separated from one another and individually formed. The photo resist 1180 may be removed, thereby resulting in a plurality of microelectronic elements that have edges reinforced with a monolithic metal ring 1020. In alternative embodiments, a dielectric layer may be provided before and/or after the step of providing a metal layer on the inclined surfaces 1075 of the groove 1074.

Figure 14:
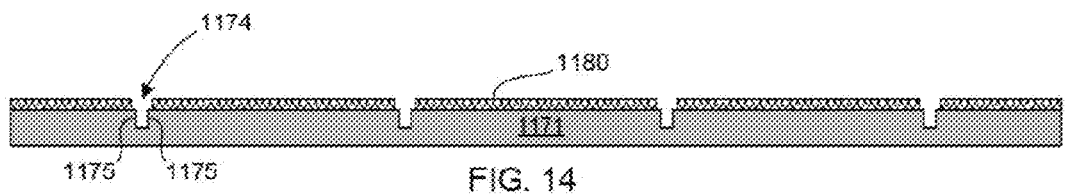
FIGS. 14, 14A, 14B, 14C, and 14D illustrate cross-sectional views of a method of making the embodiment of FIG. 11 in accordance with one embodiment.
Figure 14A:
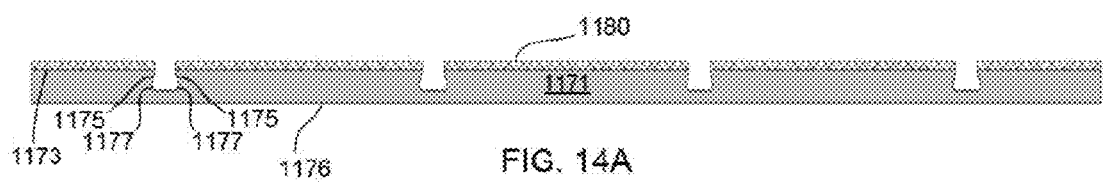
Figure 14B:
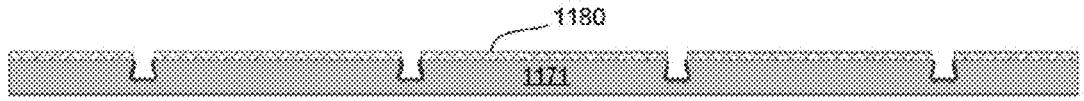
Figure 14C:
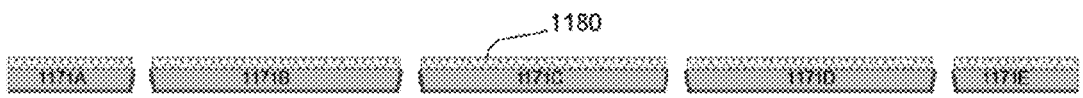
Figure 14D:
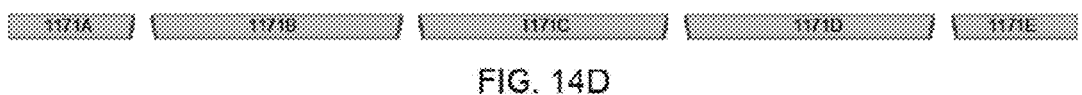

Turning now to FIGS. 14-14D, a method of making the microelectronic element 1102 of FIG. 11 in accordance with one embodiment is shown. Referring first to FIG. 14, a wafer subassembly 170 is shown that includes a wafer 1171, photoresist 1180 patterned thereon, and grooves 1174. The grooves 1174 are initially formed with relative straight edge surfaces 1175 that extend vertically between the first and second surfaces 1173,1176 of the wafer 1171. As shown in FIG. 14A, the grooves 1175 are further shaped to provide slightly angled surfaces 1175 that extend away from one another and rounded corner edges 177. To achieve this shape, the grooves 1175 may be formed using any known conventional methods of formation, such as, without limitation, use of a special saw blade, use of a laser, or sand blasting. A metal may be provided within the groove (FIG. 14B) and the wafer 1171 separated into individual microelectronic components 1171A-E (FIG. 14C). Photoresist 1180 may then be removed to provide for microelectronic elements 1171 A-E (FIG. 14D).

Figure 15:
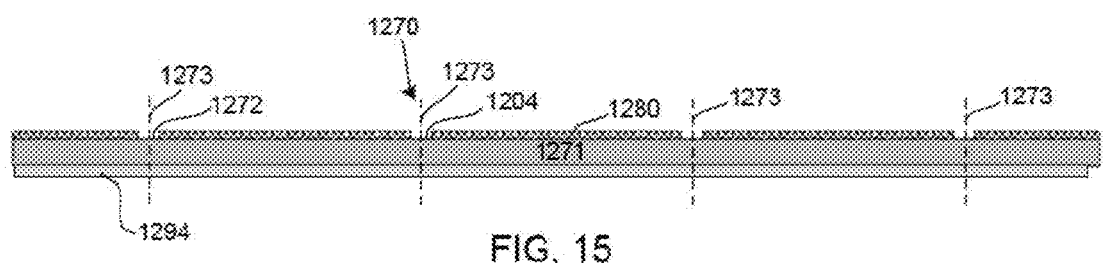
FIGS. 15, 15A, 15B, and 15C illustrate cross-sectional views of another method of making the embodiment of FIG. 2 in accordance with an alternative embodiment.
Figure 15A:
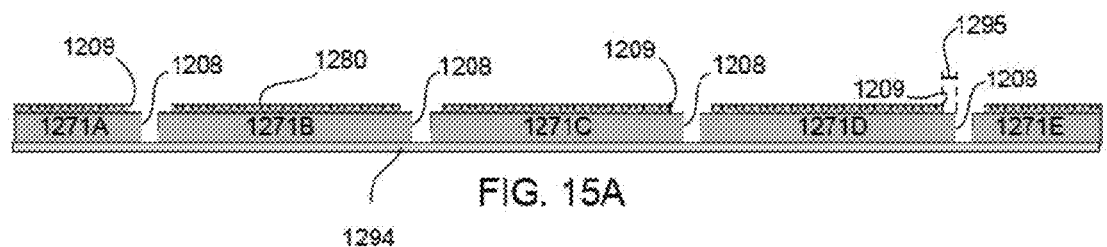
Figure 15B:
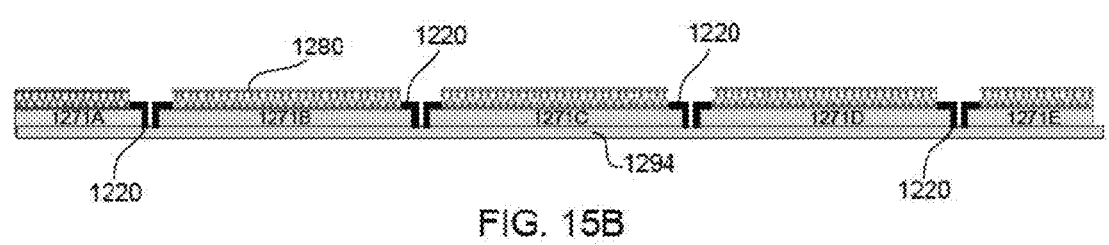
Figure 15C:
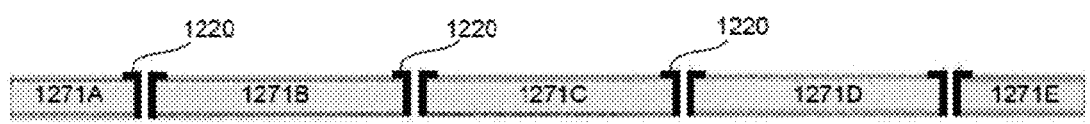

Referring now to FIGS. 15-15C, a method of making the microelectronic element 200 of FIG. 11 in accordance with an alternative embodiment is shown. Turning first to FIG. 15, a dicing tape 1294 or the like is used to support a wafer 1270. As in the previous embodiments, a resist mask 1280 can be patterned over the front surface 1204 of the wafer 1270 to define channels 1272 coincident with dicing lanes 1272. Turning to FIG. 15A, the wafer 1271 is diced along dicing lanes 1272 into individual microelectronic elements, e.g., semiconductor chips 1271A,1271B,1271C, 1271D,1271E. As shown, the wafer 1270 can be cut so that there is gap 1295 between the edge surfaces 1208 of the chips and the edges 1209 of the resist mask 1280, but the tape 1294 remains to support the diced semiconductor chips. Thereafter, a metal can be plated onto the edge surfaces 1208 of the chip and the exposed front surfaces 1204 of the chips 1271A-E to form the metal ring 1220. The resist 1280 and tape 1294 can then be removed to reveal individual microelectronic elements 1271A-E.

Figure 16:
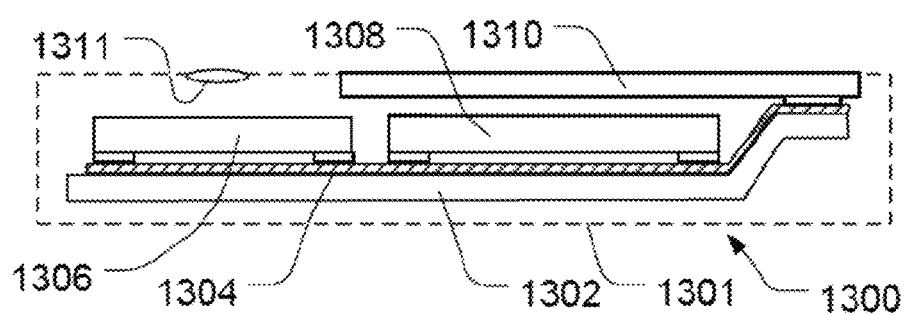
FIG. 16 is a cross-sectional view of a system incorporating an interconnection element.

The microelectronic elements discussed in the embodiments above can be utilized in construction of diverse electronic systems. For example, referring back to the microelectronic elements according to any one of the embodiments previously discussed, for example, FIG. 2, such microelectronic element can be incorporated into a system, such as the system 1300 shown in FIG. 16. For example, a microelectronic element can be incorporated in a microelectronic package 1306 or structure 1306 which is combined with other electronic components 1308 and 1310 in a system or structure 1300. In the example depicted, component 1308 is a semiconductor chip, whereas component 1310 is a display screen, but any other components can be used. Of course, although only two additional components are depicted in FIG. 16 for clarity of illustration, the system may include any number of such components. The structure 1306 as described above may be, for example, a composite chip or a structure incorporating plural chips. In a further variant, both may be provided, and any number of such structures may be used. Structure 1306 and components 1308 and 1310 are mounted in a common housing 1301, schematically depicted in broken lines, and are electrically interconnected with one another as necessary to form the desired circuit. In the exemplary system shown, the system includes a circuit panel 1302 such as a flexible printed circuit board, and the circuit panel includes numerous conductors 1304, of which only one is depicted in FIG. 16, interconnecting the components with one another. However, this is merely exemplary; any suitable structure for making electrical connections can be used. The housing 1301 is depicted as a portable housing of the type usable, for example, in a cellular telephone or personal digital assistant, and screen 1310 is exposed at the surface of the housing. Where structure 1306 includes a light-sensitive element such as an imaging chip, a lens 1311 or other optical device also may be provided for routing light to the structure. Again, the simplified system shown in FIG. 16 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of making an edge-reinforced microelectronic element, comprising:
    mechanically cutting along dicing lanes of a substrate at least partially through a thickness thereof to form a plurality of edge surfaces extending away from a front surface thereof the front surface having a plurality of contacts thereat, the substrate further including an exposed rear surface separated from the front surface by a semiconductor material and by wiring, the substrate embodying a plurality of microelectronic elements; and
    forming a continuous monolithic metallic edge-reinforcement ring covering each of the plurality of edge surfaces and extending onto the front surface.

2. The method of claim 1, wherein the step of mechanically cutting includes sawing.

3. The method of claim 1, wherein the step of mechanically cutting fully cuts through the thickness to separate the microelectronic elements from one another.

4. The method of claim 3, wherein the step of forming a continuous monolithic metallic edge-reinforcement ring occurs after the step of mechanically cutting.

5. The method of claim 1, wherein the step of mechanically cutting partially cuts through the thickness; and wherein the step of forming occurs after the step of mechanically cutting.

6. The method of claim 5, wherein during the step of mechanically cutting, a groove is formed, the groove having a base and the edge surfaces; and wherein the step of forming a continuous monolithic metallic edge-reinforcement right includes providing a metal along the base and the edge surfaces of the groove.

7. A method of making an edge-reinforced microelectronic element, comprising:
    mechanically cutting along dicing lanes of a substrate partially through a thickness thereof to expose a plurality of edge surfaces extending away from a front surface thereof the first surface having a plurality of contacts thereat, the substrate further including an exposed rear surface separated from the front surface by a semiconductor material and by wiring, the substrate embodying a plurality of microelectronic elements;
    forming a continuous monolithic metallic edge-reinforcement ring covering each of the plurality of edge surfaces and extending onto the front surface; and
    separating the microelectronic elements from one another along the dicing lanes.

8. The method of claim 7, wherein the step of mechanically cutting includes sawing.

* * * * *